United States Patent
Verplancken et al.

(10) Patent No.: US 6,905,737 B2
(45) Date of Patent: Jun. 14, 2005

(54) METHOD OF DELIVERING ACTIVATED SPECIES FOR RAPID CYCLICAL DEPOSITION

(75) Inventors: Donald J. Verplancken, Burlingame, CA (US); Ashok K. Sinha, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 332 days.

(21) Appl. No.: 10/269,335

(22) Filed: Oct. 11, 2002

(65) Prior Publication Data

US 2004/0071897 A1 Apr. 15, 2004

(51) Int. Cl.[7] .............................................. H05H 1/24
(52) U.S. Cl. ................... 427/576; 427/249.1; 427/252; 427/255.15; 427/255.18; 427/255.28; 427/255.31; 427/255.32; 427/255.394; 427/255.395; 427/419.2; 427/419.3; 427/419.7; 427/575; 427/579
(58) Field of Search ............................. 427/249.1, 252, 427/255.15, 255.18, 255.28, 255.31, 255.32, 255.394, 255.395, 419.2, 419.3, 419.7, 575, 576, 579

(56) References Cited

U.S. PATENT DOCUMENTS

| | | | |
|---|---|---|---|
| 4,058,430 A | 11/1977 | Suntola et al. | 156/611 |
| 4,389,973 A | 6/1983 | Suntola et al. | 118/725 |
| 4,413,022 A | 11/1983 | Suntola et al. | 427/255.2 |
| 4,834,831 A | 5/1989 | Nishizawa et al. | 156/611 |
| 4,993,357 A | 2/1991 | Scholz | 118/715 |
| 5,225,366 A | 7/1993 | Yoder | 437/108 |
| 5,281,274 A | 1/1994 | Yoder | 118/697 |
| 5,294,286 A | 3/1994 | Nishizawa et al. | 156/610 |
| 5,374,570 A | 12/1994 | Nasu et al. | 437/40 |

(Continued)

FOREIGN PATENT DOCUMENTS

| | | | |
|---|---|---|---|
| EP | 1 167 569 | 1/2002 | C23C/16/455 |
| GB | 2 355 727 | 5/2001 | C23C/16/44 |
| JP | 58098917 | 6/1983 | H01L/21/205 |
| JP | 4291916 | 9/1992 | |
| JP | 5047666 | 2/1993 | H01L/21/205 |
| JP | 5206036 | 8/1993 | H01L/21/205 |
| JP | 5234899 | 9/1993 | H01L/21/205 |
| JP | 5270997 | 10/1993 | C30B/29/68 |

(Continued)

OTHER PUBLICATIONS

"Atomic–layer selective deposition of silicon nitride on hydrogen–terminated Si surfaces", by Shin Yokoyama, Norihiko Ikeda, Kouji Kajikawa and Yoshimitsu Nakashima, Applied Surface Science 130–132 (1998) 352–356, no month avail.

(Continued)

Primary Examiner—Bernard Pianalto
(74) Attorney, Agent, or Firm—Moser, Patterson & Sheridan LLP

(57) ABSTRACT

A method for providing activated species for a cyclical deposition process is provided. In one aspect, the method includes delivering a gas to be activated into a plasma generator, activating the gas to create a volume of reactive species, delivering a fraction of the reactive species into a processing region to react within a substrate therein, and maintaining at least a portion of the the gas remaining in the plasma generator in an activated state after delivering the fraction of the gas into the process region. The plasma generator may include a high density plasma (HDP) generator, a microwave generator, a radio-frequency (RF) generator, an inductive-coupled plasma (ICP) generator, a capacitively coupled generator, or combinations thereof.

17 Claims, 3 Drawing Sheets

U.S. PATENT DOCUMENTS

| | | |
|---|---|---|
| 5,441,703 A | 8/1995 | Jurgensen .................... 422/129 |
| 5,443,647 A | 8/1995 | Aucoin et al. .............. 118/723 |
| 5,480,818 A | 1/1996 | Matsumoto et al. .......... 437/40 |
| 5,483,919 A | 1/1996 | Yokoyama et al. ........... 117/89 |
| 5,503,875 A | 4/1996 | Imai et al. ............... 427/255.3 |
| 5,674,786 A | 10/1997 | Turner et al. ............... 437/225 |
| 5,711,811 A | 1/1998 | Suntola et al. .............. 118/711 |
| 5,796,116 A | 8/1998 | Nakata et al. ................ 257/66 |
| 5,807,792 A | 9/1998 | Ilg et al. ...................... 438/758 |
| 5,835,677 A | 11/1998 | Li et al. ....................... 392/401 |
| 5,855,680 A | 1/1999 | Soininen et al. ............ 118/719 |
| 5,879,459 A | 3/1999 | Gadgil et al. ............... 118/715 |
| 5,916,365 A | 6/1999 | Sherman ..................... 117/92 |
| 5,923,056 A | 7/1999 | Lee et al. .................... 257/192 |
| 6,013,553 A | 1/2000 | Wallace et al. ............. 438/287 |
| 6,015,590 A | 1/2000 | Suntola et al. ......... 427/255.23 |
| 6,015,917 A | 1/2000 | Bhandari et al. ............. 556/12 |
| 6,042,652 A | 3/2000 | Hyun et al. ................. 118/719 |
| 6,060,755 A | 5/2000 | Ma et al. .................... 257/410 |
| 6,084,302 A | 7/2000 | Sandhu ....................... 257/751 |
| 6,124,158 A | 9/2000 | Dautartas et al. ........... 438/216 |
| 6,139,700 A | 10/2000 | Kang et al. ............ 204/192.17 |
| 6,143,659 A | 11/2000 | Leem ......................... 438/688 |
| 6,144,060 A | 11/2000 | Park et al. .................. 257/310 |
| 6,162,501 A | 12/2000 | Kim ....................... 427/255.32 |
| 6,174,377 B1 | 1/2001 | Doering et al. ............. 118/729 |
| 6,174,809 B1 | 1/2001 | Kang et al. ................. 438/682 |
| 6,183,563 B1 | 2/2001 | Choi et al. .................. 118/715 |
| 6,197,683 B1 | 3/2001 | Kang et al. ................. 438/643 |
| 6,200,893 B1 | 3/2001 | Sneh .......................... 438/685 |
| 6,203,613 B1 | 3/2001 | Gates et al. ................. 117/104 |
| 6,207,487 B1 | 3/2001 | Kim et al. ................... 438/238 |
| 6,231,672 B1 | 5/2001 | Choi et al. .................. 118/715 |
| 6,238,734 B1 | 5/2001 | Senzaki et al. ............. 427/226 |
| 6,270,572 B1 | 8/2001 | Kim et al. .................... 117/93 |
| 6,284,646 B1 | 9/2001 | Leem ......................... 438/629 |
| 6,287,965 B1 | 9/2001 | Kang et al. ................. 438/648 |
| 6,297,539 B1 | 10/2001 | Ma et al. .................... 257/410 |
| 6,305,314 B1 | 10/2001 | Sneh et al. .................. 118/723 |
| 6,306,216 B1 | 10/2001 | Kim et al. ................... 118/725 |
| 6,342,277 B1 | 1/2002 | Sherman ..................... 427/562 |
| 6,348,376 B2 | 2/2002 | Lim et al. .................... 438/253 |
| 6,358,829 B2 | 3/2002 | Yoon et al. .................. 438/597 |
| 6,372,598 B2 | 4/2002 | Kang et al. ................. 438/399 |
| 6,379,748 B1 | 4/2002 | Bhandari et al. ...... 427/255.394 |
| 6,391,785 B1 | 5/2002 | Satta et al. .................. 437/704 |
| 6,391,803 B1 | 5/2002 | Kim et al. ................... 438/787 |
| 6,399,491 B2 | 6/2002 | Jeon et al. ................... 438/680 |
| 6,416,577 B1 | 7/2002 | Suntoloa et al. ............. 117/88 |
| 6,416,822 B1 | 7/2002 | Chiang et al. .............. 427/561 |
| 6,428,859 B1 | 8/2002 | Chiang et al. .............. 427/457 |
| 6,447,607 B2 | 9/2002 | Soininen et al. ............ 117/200 |
| 6,451,119 B2 | 9/2002 | Sneh et al. .................. 118/715 |
| 6,451,695 B2 | 9/2002 | Sneh .......................... 438/685 |
| 6,468,924 B2 | 10/2002 | Lee et al. .................... 438/763 |
| 6,475,276 B1 | 11/2002 | Elers et al. .................. 117/84 |
| 6,475,910 B1 | 11/2002 | Sneh .......................... 438/685 |
| 6,478,872 B1 | 11/2002 | Chae et al. ................... 117/88 |
| 6,481,945 B1 | 11/2002 | Hasper et al. ............... 414/217 |
| 6,482,262 B1 | 11/2002 | Elers et al. .................. 117/84 |
| 6,482,733 B2 | 11/2002 | Raaijmakers ............... 438/633 |
| 6,482,740 B2 | 11/2002 | Soininen et al. ............ 438/686 |
| 6,492,283 B2 | 12/2002 | Raaijmakers et al. ....... 438/770 |
| 6,511,539 B1 | 1/2003 | Raaijmakers ............... 117/102 |
| 6,551,406 B2 | 4/2003 | Kilpi .......................... 118/728 |
| 2001/0000866 A1 | 5/2001 | Sneh et al. .................. 118/723 |
| 2001/0002280 A1 | 5/2001 | Sneh ...................... 427/255.28 |
| 2001/0009140 A1 | 7/2001 | Bondestan et al. ......... 118/725 |
| 2001/0009695 A1 | 7/2001 | Saanila et al. ......... 427/255.39 |
| 2001/0011526 A1 | 8/2001 | Doering et al. ............. 118/729 |
| 2001/0013312 A1 | 8/2001 | Soininen et al. .............. 117/86 |
| 2001/0014371 A1 | 8/2001 | Kilpi ..................... 427/255.28 |
| 2001/0024387 A1 | 9/2001 | Raaijmakers et al. ........ 365/200 |
| 2001/0028924 A1 | 10/2001 | Sherman ................ 427/255.38 |
| 2001/0041250 A1 | 11/2001 | Werkhoven et al. ........ 428/212 |
| 2001/0042523 A1 | 11/2001 | Kesala ........................ 122/6.6 |
| 2001/0042799 A1 | 11/2001 | Kim et al. ................... 239/553 |
| 2001/0050039 A1 | 12/2001 | Park ........................... 117/102 |
| 2001/0054377 A1 | 12/2001 | Lindfors et al. ............ 117/104 |
| 2001/0054730 A1 | 12/2001 | Kim et al. ................... 257/301 |
| 2002/0000196 A1 | 1/2002 | Park ........................... 118/715 |
| 2002/0000598 A1 | 1/2002 | Kang et al. ................. 257/301 |
| 2002/0001974 A1 | 1/2002 | Chan .......................... 438/785 |
| 2002/0007790 A1 | 1/2002 | Park ........................... 118/715 |
| 2002/0015790 A1 | 2/2002 | Baum et al. ........... 427/255.28 |
| 2002/0020869 A1 | 2/2002 | Park et al. ................... 257/306 |
| 2002/0021544 A1 | 2/2002 | Cho et al. ................... 361/200 |
| 2002/0025979 A1 | 2/2002 | Kunz et al. ................. 514/411 |
| 2002/0031618 A1 | 3/2002 | Sherman ..................... 427/569 |
| 2002/0034123 A1 | 3/2002 | Fuengeld ..................... 367/99 |
| 2002/0041931 A1 | 4/2002 | Suntola et al. ......... 427/255.28 |
| 2002/0042165 A1 | 4/2002 | Putkonen .................... 438/142 |
| 2002/0047151 A1 | 4/2002 | Kim et al. ................... 257/301 |
| 2002/0048635 A1 | 4/2002 | Kim et al. ................... 427/331 |
| 2002/0052097 A1 | 5/2002 | Park ........................... 438/507 |
| 2002/0054769 A1 | 5/2002 | Nakamura .................... 399/15 |
| 2002/0066411 A1 | 6/2002 | Chiang et al. .............. 118/724 |
| 2002/0068458 A1 | 6/2002 | Chiang et al. .............. 438/694 |
| 2002/0073924 A1 | 6/2002 | Chiang et al. .......... 118/723 R |
| 2002/0076481 A1 | 6/2002 | Chiang et al. ................. 427/8 |
| 2002/0076507 A1 | 6/2002 | Chiang et al. .............. 427/569 |
| 2002/0076508 A1 | 6/2002 | Chiang et al. .............. 427/569 |
| 2002/0076837 A1 | 6/2002 | Hujanen et al. ................ 438/3 |
| 2002/0081844 A1 | 6/2002 | Jeon et al. ................... 438/680 |
| 2002/0086106 A1 | 7/2002 | Park et al. ............... 427/248.1 |
| 2002/0092471 A1 | 7/2002 | Kang et al. ................. 118/715 |
| 2002/0094689 A1 | 7/2002 | Park ........................... 438/694 |
| 2002/0098627 A1 | 7/2002 | Pomarede et al. ........... 438/149 |
| 2002/0104481 A1 | 8/2002 | Chiang et al. .............. 118/723 |
| 2002/0106451 A1 | 8/2002 | Skarp et al. ............. 427/248.1 |
| 2002/0106536 A1 | 8/2002 | Lee et al. .................... 428/702 |
| 2002/0108570 A1 | 8/2002 | Lindfors et al. |
| 2002/0115252 A1 | 8/2002 | Haukka et al. ............. 438/240 |
| 2002/0134307 A1 | 9/2002 | Choi .......................... 118/715 |
| 2002/0144655 A1 | 10/2002 | Chiang et al. .............. 118/715 |
| 2002/0144657 A1 | 10/2002 | Chiang et al. .......... 118/723 E |
| 2002/0146511 A1 | 10/2002 | Chiang et al. ........... 427/248.1 |
| 2002/0146895 A1 | 10/2002 | Ramdani et al. ............ 438/497 |
| 2002/0153579 A1 | 10/2002 | Yamamoto .................. 257/412 |
| 2002/0155722 A1 | 10/2002 | Satta et al. .................. 438/704 |
| 2002/0162506 A1 | 11/2002 | Sneh et al. .................. 118/715 |
| 2002/0164421 A1 | 11/2002 | Chiang et al. ........... 427/248.1 |
| 2002/0164423 A1 | 11/2002 | Chiang et al. ......... 427/255.28 |
| 2002/0177282 A1 | 11/2002 | Song .......................... 438/300 |
| 2002/0182320 A1 | 12/2002 | Leskela et al. .............. 427/250 |
| 2002/0187256 A1 | 12/2002 | Elers et al. .................... 427/99 |
| 2002/0187631 A1 | 12/2002 | Kim et al. ................... 438/637 |
| 2002/0196591 A1 | 12/2002 | Hujanen et al. ............ 360/326 |
| 2002/0197402 A1 | 12/2002 | Chiang et al. ......... 427/255.39 |
| 2002/0197831 A1 | 12/2002 | Todd et al. .................. 438/528 |
| 2003/0013320 A1 | 1/2003 | Kim et al. ................... 438/778 |
| 2003/0031807 A1 | 2/2003 | Elers et al. .................. 427/569 |
| 2003/0042630 A1 | 3/2003 | Babcoke et al. ......... 261/121.1 |
| 2003/0049942 A1 | 3/2003 | Haukka et al. ............. 438/778 |
| 2003/0072975 A1 | 4/2003 | Shero et al. ................. 428/704 |
| 2003/0075273 A1 | 4/2003 | Kilpela et al. .......... 156/345.33 |
| 2003/0075925 A1 | 4/2003 | Lindfors et al. ............ 285/367 |
| 2003/0082296 A1 | 5/2003 | Elers et al. .................... 427/96 |

FOREIGN PATENT DOCUMENTS

| | | | |
|---|---|---|---|
| JP | 6224138 | 5/1994 | ........... C30B/25/14 |

| | | | | |
|---|---|---|---|---|
| JP | 2000319772 | 3/2000 | ............ | C23C/16/00 |
| JP | 2001020075 | 11/2000 | ............ | C23C/16/44 |
| JP | 2001/111000 | 4/2001 | ......... | H01L/27/105 |
| JP | 2001172767 | 6/2001 | ............ | C23C/16/40 |
| WO | WO 96/17107 | 6/1996 | ............ | C23C/16/44 |
| WO | WO 99/01595 | 1/1999 | ............ | C30B/25/14 |
| WO | WO 99/29924 | 6/1999 | ............ | C23C/16/04 |
| WO | WO 99/65064 | 12/1999 | ............ | H01L/21/00 |
| WO | WO 0015865 | 3/2000 | ............ | C23C/16/00 |
| WO | WO 0016377 | 3/2000 | | |
| WO | WO 00/54320 | 9/2000 | ............ | H01L/21/44 |
| WO | WO 00/79576 | 12/2000 | ......... | H01L/21/205 |
| WO | WO 01/15220 | 3/2001 | ......... | H01L/21/768 |
| WO | WO 01/17692 | 3/2001 | ............ | B05C/11/00 |
| WO | WO 01/27346 | 4/2001 | ............ | C23C/16/44 |
| WO | WO 01/27347 | 4/2001 | ............ | C23C/16/44 |
| WO | WO 01/29280 | 4/2001 | ............ | C23C/16/32 |
| WO | WO 01/29891 | 4/2001 | ......... | H01L/21/768 |
| WO | WO 01/29893 | 4/2001 | ......... | H01L/21/768 |
| WO | WO 01/36702 | 5/2001 | ............ | C23C/16/00 |
| WO | WO 01/82390 | 11/2001 | ............ | H01L/51/20 |
| WO | WO 01/88972 | 11/2001 | ......... | H01L/21/321 |
| WO | WO 02/08485 | 1/2002 | ............ | C23C/16/00 |
| WO | WO 02/08488 | 1/2002 | ............ | C23C/16/44 |
| WO | WO 02/09167 | 1/2002 | ......... | H01L/21/316 |
| WO | WO 2002/31875 | 4/2002 | ......... | H01L/21/316 |
| WO | WO 02/43115 | 5/2002 | | |
| WO | WO 02/45167 | 6/2002 | ............ | H01L/27/00 |
| WO | WO 02/067319 | 8/2002 | ......... | H01L/21/768 |

OTHER PUBLICATIONS

"Atomic layer epitaxy deposition process" by S. M. Bedair, J. Vac. Sci. Technol. B. 12(1), 179 (Jan./Feb. 1994).

"Atomic layer epitaxy of Si using atomic H" by Shigeru Imai, Toshio Iizuka, Osamu Sugiura and Masakiyo Matsumura, Thin Solid Films 225, 168 (1993), no month avail.

Kukli, et al., "Tailoring the Dielectric Properties of $HfO_2$–$Ta_2$–$O_5$ Nanolaminates," Applied Physics Letters, vol. 68, No. 26, Jun. 24, 1996; p. 3737–9.

Kukli, et al. "Atomic Layer Epitaxy Growth of Tantalum Oxide Thin Films from $Ta(OC_2H_5)_5$ and $H_2O$," Journal of the Electrochemical Society, vol. 142, No. 5, May 1995; p. 1670–5.

Kukli, et al., "In situ Study of Atomic Layer Epitaxy Growth of Tantalum Oxide Thin Films From $Ta(OC_2H_5)_5$ and $H_2O$," Applied Surface Science, vol. 112, Mar. 1997, p. 236–42.

Kukli, et al., "Properties of $Ta_2O_5$–Based Dielectric Nanolaminates Deposited by Atomic Layer Epitaxy," Journal of the Electrochemical Society, vol. 144, No. 1, Jan. 1997; p. 300–6.

Kukli, et al., "Properties of $\{Nb_{1-x}Ta_x\}_2$ $O_5$ Solid Solutions and $\{Nb_{1-x}Ta_x\}_2O_5$–$ZrO_2$ Nanolaminates Grown by Atomic Layer Epitaxy," 1997; p. 785–93, no month avail.

Ritala, M., et al., "Chemical Vapor Deposition," Jan. 1999, p. 6–9.

Rossnagel, et al. "Plasma–enhanced Atomic Layer Deposition of Ta and Ti for Interconnect Diffusion Barriers," J. Vac. Sci. Technol. B., vol. 18, No. 4 (Jul. 2000); p2016–20.

Niinisto, et al. "Synthesis of Oxide Thin Films and Overlayers by Atomic Layer Epitaxy for Advanced Applications," Materials Science and Engineering B41 (1996) 23–29, no month avail.

Eisenbraum, et al. "Atomic Layer Deposition (ALD) of Tantalum–based materials for zero thickness copper barrier applications," Proceedings of the IEEE 2001 International Interconnect Technology Conference (Cat. No. 01EX461) 2001, no month avail.

Clark–Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001 no month avail.

METHOD OF DELIVERING ACTIVATED SPECIES FOR RAPID CYCLICAL DEPOSITION

BACKGROUND OF THE INVENTION

1. Field of the Invention

Embodiments of the present invention relate to a method for manufacturing integrated circuit devices. More particularly, embodiments of the present invention relate to a method of providing activated precursors gases to a rapid cycle deposition process.

2. Description of the Related Art

Atomic layer deposition (ALD) is based on the exchange of chemical molecules or atoms between alternating reactants to deposit monolayers of material on a substrate surface. The monolayers maybe sequentially deposited one over the other to form a film composed of a plurality of individual layers to provide a desired film thickness. Typically, the alternating reactant is introduced into a processing chamber having a substrate in which a film is to be deposited is disposed therein, separately from a different reactant. A purge gas and pump system are used between pulses of alternately introduced reactants to prevent any overlap or coreaction between the reactants other than on the substrate. Each separate deposition step theoretically goes to saturation and self terminates, depositing at least a single molecular or atomic monolayer of material. Accordingly, the deposition is the outcome of a chemical or physical reaction between each of the alternating reactants and the substrate surface.

Compared to bulk deposition processes, such as chemical vapor deposition (CVD) and physical vapor deposition (PVD) for example, ALD is a slow process. Slower rates of deposition are not helpful toward achieving competitive performance and productivity. Since ALD reactions follow the kinetics of molecular-surface interaction, one solution to increase the deposition rate is to increase the kinetics of the molecular-surface interactions. The kinetics of molecular-surface interactions depends on the individual reaction rate between reactants and the substrate surface on which the materials are deposited. Therefore, the kinetics of molecular-surface interactions can be increased by increasing the reactivity of the individual reactants.

A common approach to increasing gas reactivity is to decompose the gas, generating ions/radicals that are highly reactive, especially at lower temperatures. This form of gas decomposition can be accomplished using various techniques, of which plasma technology is well known. Plasma technology generates high energy electrons that partially decompose and/or ionize the reactant gases and can be powered using various sources, such as microwave and radio frequency (RF), for example.

However, cyclical deposition processes utilizing plasma generation to activate reactant gases suffer many drawbacks. A major drawback is the ability to sustain a plasma of reactive gases within a processing chamber during the deposition process. Cyclical deposition processes, such as ALD, require rapid, repetitive pulses of reactants sometimes as fast as 300 milliseconds or less. Often, when the reactive gases are pulsed into a processing chamber, the plasma in the chamber is depleted or extinguished and must be re-established prior to a subsequent cycle. In a quest to increase product throughput, time does not allow for the repeated regeneration or re-ignition of a plasma between each step of the deposition process.

There is a need, therefore, for a cyclical deposition process capable of repeatably and reliably delivering activated gases to a processing chamber.

SUMMARY OF THE INVENTION

The present invention generally provides a method for delivering activated species to a cyclical deposition process. In one aspect, the method includes delivering a gas to be activated into a plasma generator, activating the gas to create a volume of reactive species, delivering a fraction of the reactive species into a processing region to react within a substrate therein, and maintaining at least a portion of the gas remaining in the plasma generator in an activated state after delivering the fraction of the gas into the process region.

A method for depositing films on a substrate surface is also provided. In one aspect, the method includes delivering a gas to be activated into a plasma generator and activating the gas to create a volume of one or more reactive species. The method also includes sequentially pulsing a fraction of the one or more reactive species and a second reactive compound into a processing region to deposit a film on the substrate surface, while maintaining at least a portion of at least one of said first and second gases in an activated state between pulses. In another aspect, the method includes delivering a first gas to be activated into a first plasma generator, activating at least a portion of the first gas to create a volume of one or more first reactive species, providing a second gas to be activated into a second plasma generator, and activating at least a portion of the second gas to create a volume of one or more second reactive species. The method further includes sequentially pulsing the first activated gas and the second activated gas to a processing region to deposit a film on the substrate surface, while maintaining at least a portion of at least one of said first and second gases in an activated state between pulses.

In any of the embodiments above, the plasma generator may include a high density plasma (HDP) generator, a microwave generator, radio-frequency (RF) generator, an inductive-coupled plasma (ICP) generator, a capacitively coupled generator, or any combination thereof.

BRIEF DESCRIPTION OF THE DRAWINGS

So that the manner in which the above recited features of the present invention, and other features contemplated and claimed herein, are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
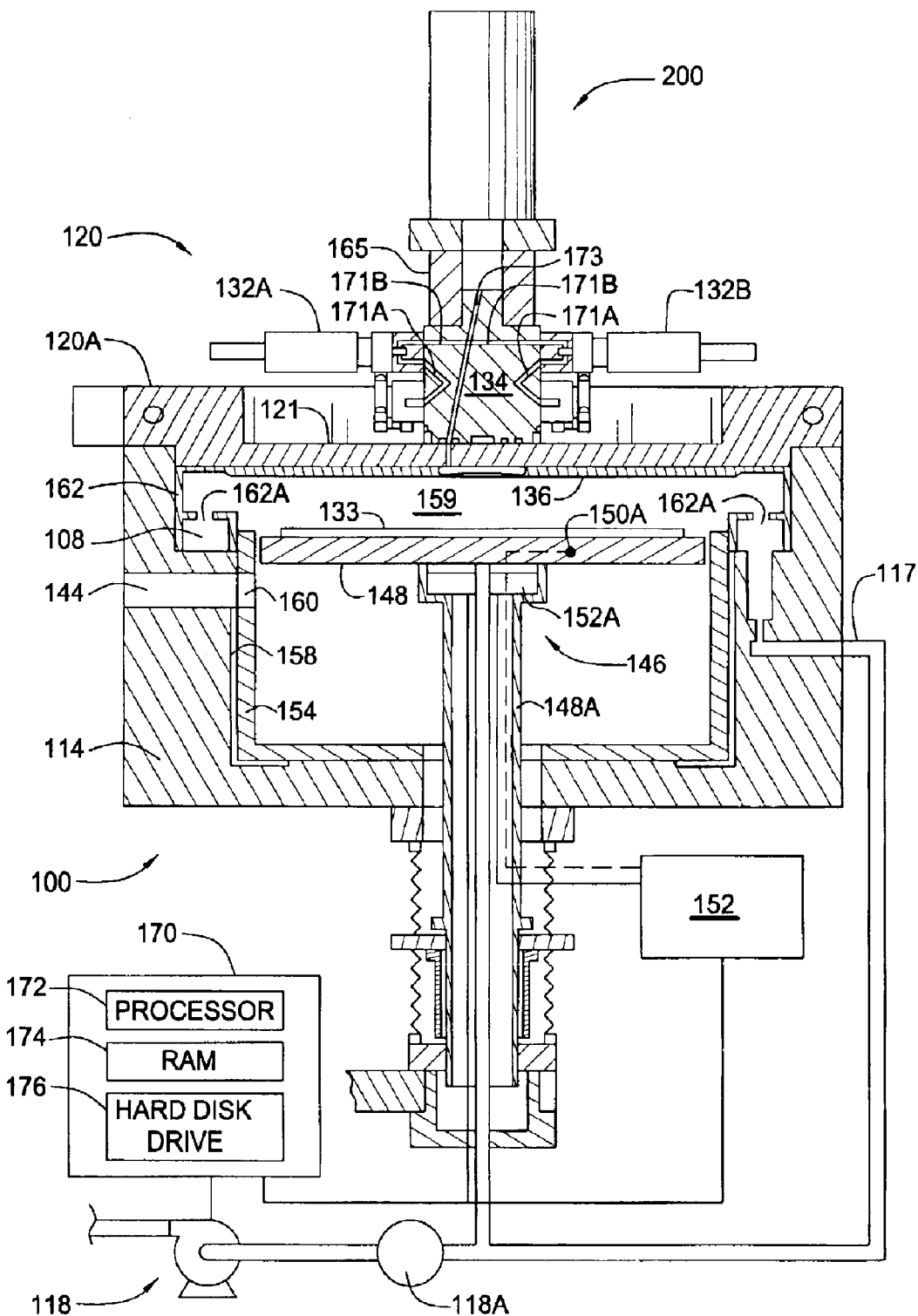
FIG. 1 shows a partial cross section view of an exemplary processing system having a plasma generator 200 according to one embodiment of the present invention in fluid communication with an exemplary processing chamber 100.

The present invention provides a plasma generator having a close proximity to a processing chamber to provide one or more activated compounds for use in a radical-assisted, rapid cycle deposition process. The term "compound" is intended to include one or more precursors, reductants, reactants, and catalysts, or a combination thereof. The term "compound" is also intended to include a grouping of compounds, such as when two or more compounds are introduced in a processing system at the same time. For example, a grouping of compounds may include one or more catalysts and one or more precursors. The term "activated" as used herein refers to any one or more ions, electrons, and/or radicals generated by catalysis, ionization, decomposition, dissociation, thermal degradation, or any combination thereof.

"Rapid cycle deposition" as used herein refers to the repetitive pulsing/dosing of two or more compounds to deposit a conformal layer on a substrate surface whereby each pulse/dose of compound has a duration less than about 300 milliseconds. The two or more compounds may be alternately or simultaneously pulsed into a reaction zone of a processing chamber having a substrate surface in which a film is to be deposited is disposed therein. When the two or more compounds are alternately pulsed, the compounds may be separated by a time delay/pause to allow each compound to adhere and/or react on the substrate surface. For example, a first compound or compound A is dosed/pulsed into the reaction zone followed by a first time delay/pause. Next, a second compound or compound B is dosed/pulsed into the reaction zone followed by a second time delay. When a ternary material is desired, such as titanium silicon nitride or tantalum silicon nitride for example, a third compound (C), is dosed/pulsed into the reaction zone followed by a third time delay. These sequential tandems of a pulse of reactive compound followed by a time delay may be repeated indefinitely until a desired film or film thickness is formed on the substrate surface.

The term "pulse" or "dose" as used herein is intended to refer to a quantity of a particular compound that is intermittently or non-continuously introduced into the processing chamber. The quantity of a particular compound within each pulse may vary over time, depending on the duration of the pulse. However, a continuous flow of a particular compound is also contemplated by the present invention as described herein and thus, is not outside the scope thereof.

The term "substrate surface" as used herein is intended to refer to any workpiece or surface upon which film processing is performed. For example, the term "substrate surface" may be used to describe any semiconductor substrate, such as a silicon wafer or other substrate on which integrated circuits and other electronic devices are formed, including flat panel displays. The term "substrate surface" is also used to describe any material formed on a substrate, including conductive, semiconductive, and insulative layers.

FIG. 1 shows a partial cross section view of an exemplary processing system having a plasma generator 200 according to one embodiment. As shown, the plasma generator 200 is in fluid communication with a processing chamber 100. The plasma generator 200 at least partially dissociates compounds into atomic or ionic species and provides at least a portion, if not all, of these activated species/compounds to the processing chamber 100 to form a film on a substrate surface therein.

The plasma generator 200 is a continuous, steady-state system, having a fixed internal volume. The plasma generator 200 is configured such that an amount of activated compound that exits the generator 200 via a pulse to the processing chamber 100 is replenished with a corresponding amount of non-activated compound. Accordingly, the generator 200 is able to operate at a steady-state with respect to gas volume and contains both activated and non-activated compounds at any given time.

The generator 200 acts as a reservoir because a gas volume contained therein is substantially greater than a pulse volume of compound that is introduced into the processing chamber 100 during deposition. For example, the generator 200 may contain up to 20 times the pulse volume required for deposition although any size or volume is envisioned. The generator 200 should be sized so that when a pulse of activated compound exits the plasma generator 200, the energy of the compounds within the generator 200 is not affected. As a result, at least a portion of the activated compound remaining in the generator 200 is maintained in a plasma state. Additionally, the generator 200 should be sized so that a desired number of activated species are available for delivery to a given deposition process. As a result, the plasma generator 200 does not require a separate ignition step to generate or sustain the plasma therein between each pulse, and product throughput is substantially increased. Instead, activated compounds remaining in the plasma generator 200 are repeatedly available for pulsing into the processing chamber 100 according to process recipe requirements without extinguishing or diluting the plasma within the plasma generator 200.

One exemplary plasma generator 200 is a remote plasma source disposed in close proximity to the processing chamber 100. The plasma generator 200 may be located adjacent, underneath, either directly on or adjacent the processing chamber 100. Preferably, the plasma generator 200 is disposed directly on an upper/top surface of the chamber 100, as shown in FIG. 1. However, the plasma generator 200 may be formed integrally with the processing chamber 100, as opposed to extending externally outward from the processing chamber 100 as separate components. An integrally formed plasma generator is shown and described in co-pending application Ser. No. 10/066,131, filed on Jan. 30, 2002 and entitled "Method and Apparatus For Substrate Processing", which is incorporated by reference herein.

The plasma generator 200 should be disposed a minimum distance from the processing chamber 100. Product throughput and the efficiency of the system are greatly improved by reducing the distance between the plasma generator 200 and the processing chamber 100. As such, a separate time-consuming ignition step is eliminated from the deposition process. Less energy is also required to generate and sustain the formation of reactive compounds. Most importantly, however, the reactive compounds experience a minimum level of energy loss during delivery to the substrate surface, thereby increasing the reaction kinetics of the deposition and providing a reliable and repeatable process.

The plasma generator 200 may be, for example, a high density plasma (HDP) generator, a microwave generator, radio-frequency (RF) generator, an inductive-coupled plasma (ICP) generator, a capacitively coupled generator, or any combination thereof. For ease and clarity of description, however, the plasma generator 200 will be described below in terms of an inductive coil plasma (ICP) generator with reference to FIG. 2.

Figure 2:
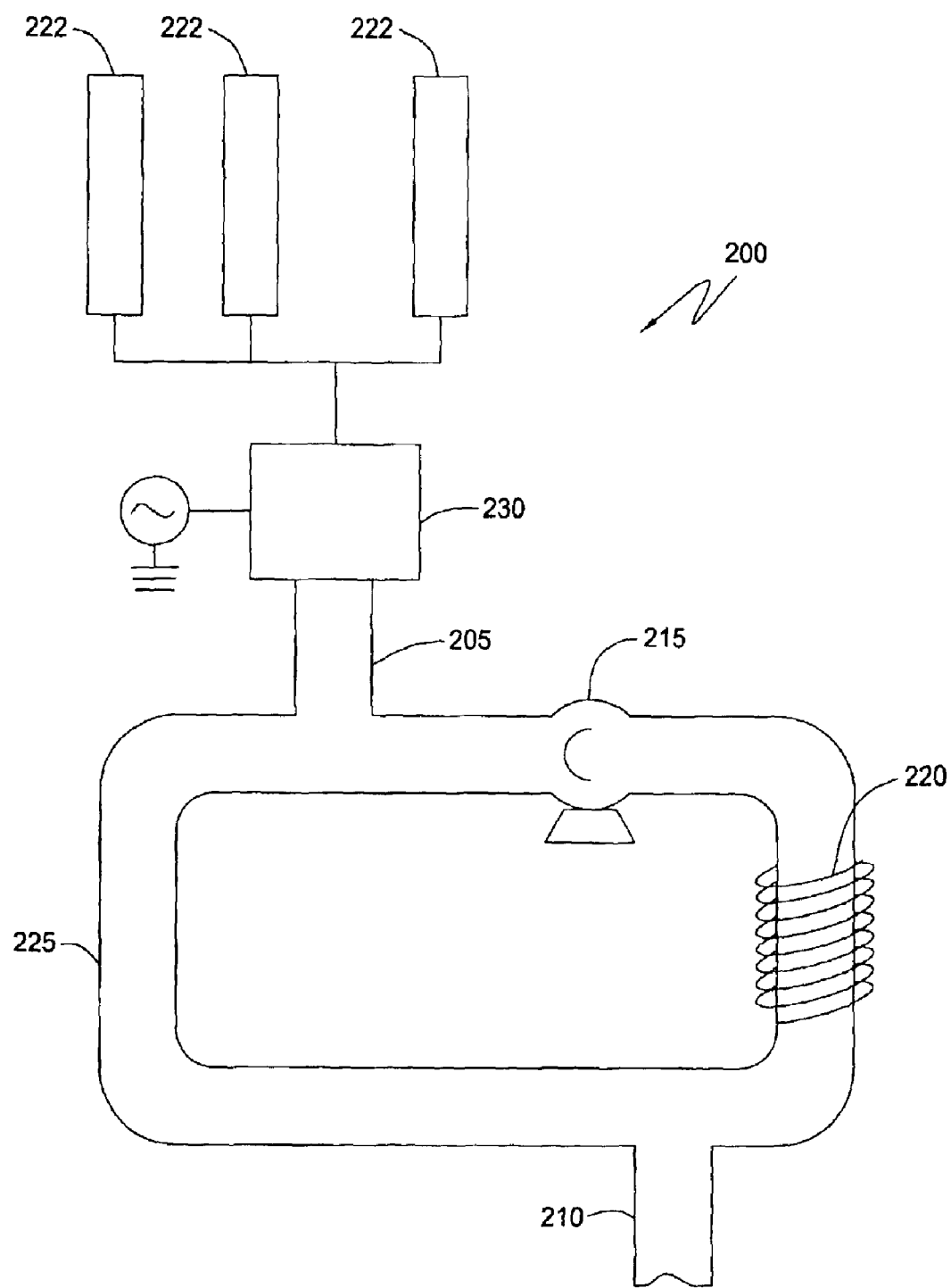
FIG. 2 shows a partial schematic view of an exemplary plasma generator 1200 utilizing an inductive coil plasma (ICP) technology.

FIG. 2 shows a partial schematic view of an exemplary plasma generator 200 utilizing an ICP generator. As shown, the plasma generator 200 includes at minimum, an inlet 205, an outlet 210, a circulation pump 215, inductive coils 220, and a hollow conduit 225. The inlet 205 is in fluid communication with one or more chemical sources 222 (three are shown for illustrative purposes). The outlet 210 is in fluid communication with a gas delivery system disposed within the processing chamber 100.

The hollow conduit 225 is a tubular member defining an activation or internal volume 250 therein. The circulation pump 215 is disposed in fluid communication within the hollow conduit 225, and may be any pump compatible with the process gases. It is believed that the activation volume 250 is directly proportional to the number of activated species generated within the plasma generator 200. In other words, the larger the volume of the activation volume 250, the greater the number of activated species contained therein. The inductive coils 220 are disposed about the hollow conduit 225 and utilize RF energy to excite the gas within the hollow conduit 225 forming a plasma of reactive compounds therein.

The chemical sources 222 store/contain the compounds used for deposition. The compounds may be stored in either solid, liquid, or gas phases. In the event that a gas/vapor phase is required, the plasma generator 200 may utilize a vaporizer/bubbler 230 in fluid communication therewith to guarantee delivery of a gas to the inlet 205. As mentioned above, the chemical sources 222 and the activation volume 250 may be pressure regulated so that a corresponding amount of compound that leaves the hollow conduit 225 is replenished from the chemical services 222. This maintains a steady-state operation throughout the plasma generator 200.

Considering the processing chamber 100 in further detail, the processing chamber 100 includes a chamber body 114, a lid assembly 120 for gas delivery, and a thermally controlled substrate support member 146, as shown in FIG. 1. The thermally controlled substrate support member 146 includes a wafer support pedestal 148 connected to a support shaft 148A. The thermally controlled substrate support member 146 may be moved vertically within the chamber body 114 so that a distance between the support pedestal 148 and the lid assembly 120 may be controlled.

The support pedestal 148 includes an embedded thermocouple 150A that may be used to monitor the temperature thereof. For example, a signal from the thermocouple 150A may be used in a feedback loop to control power applied to a heater element 152A by a power source 152. The heater element 152A may be a resistive heater element or other thermal transfer device disposed within or in contact with the pedestal 148 utilized to control the temperature thereof. Optionally, the support pedestal 148 may be heated using a heat transfer fluid (not shown).

The support pedestal 148 may be formed from any process-compatible material, including aluminum nitride and aluminum oxide ($Al_2O_3$ or alumina) and may also be configured to hold a substrate thereon employing a vacuum, i.e. support pedestal 148 may be a vacuum chuck. Using a vacuum check, the support pedestal 148 may include a plurality of vacuum holes (not shown) that are placed in fluid communication with a vacuum source routed through the support shaft 148A.

The chamber body 114 includes a liner assembly 154 formed from any suitable material such as aluminum, ceramic and the like. The chamber body 114 and the liner assembly 154 define a chamber channel 158 there between. A purge gas is introduced into the channel 158 to minimize unwanted deposition on the chamber walls and to control the rate of heat transfer between the chamber walls and the liner assembly 154.

The chamber body 114 also includes a pumping channel 162 disposed along the sidewalls thereof. The pumping channel 162 includes a plurality of apertures 162A and is coupled to a pump system 118 via a conduit 117. A throttle valve 118A is coupled between the pumping channel 162 and the pump system 118. The pumping channel 162, the throttle valve 118A, and the pump system 118 control the amount of gas flow from the processing chamber 100. The size, number, and position of the apertures 162A in communication with the chamber 100 are configured to achieve uniform flow of gases exiting the lid assembly 120 over the support pedestal 148 having a substrate disposed thereon.

The lid assembly 120 includes a lid plate 120A having a gas manifold 134 mounted thereon. The lid plate 120A provides a fluid tight seal with an upper fraction of the chamber body 114 when in a closed position. The gas manifold 134 includes one or more valves 132 (two are shown, 132A, 132B). The valves 132 may be type of valve capable of precisely and repeatedly delivering short pulses of compounds into the chamber 100. In some cases, the on/off cycles or pulses of the valves 132 may be as fast as about 100 msec or less. Typically, the on/off cycles of the valves are between 100 msec and 1 second. Exemplary valves 132 capable of these rapid cycles times are electronically controlled (EC) valves commercially available from Fujikin of Japan as part number FR-21-6.35 UGF—APD. Other valves that operate at substantially the same speed and precision may also be used.

The processing chamber 100 further includes a reaction zone 159 that is formed within the chamber body 114 when the lid assembly 120 is in a closed position. Generally, the reaction zone 159 includes the volume within the processing chamber 100 that is in fluid communication with a wafer 133 disposed therein. The reaction zone 159, therefore, includes the volume downstream of each valve 132 within the lid assembly 120, and the volume between the support pedestal 148 and the lower surface of the lid plate 120. More particularly, the reaction zone 159 includes the volume between the outlet of the valves 132 and an upper surface of the wafer 133.

A controller 170, such as a programmable logic computer (PLC), regulates the operations of the various components of the processing chamber 100. The controller 170 typically includes a processor 172 in data communication with memory, such as random access memory 174 and a hard disk drive 176. The controller 170 is in communication with at least the pump system 118, the power source 152, and the valves 132. An exemplary controller 170 is described in more detail in the co-pending U.S. patent application Ser. No. 09/800,881, entitled "Valve Control System For ALD Chamber", filed on Mar. 7, 2001, which is incorporated by reference herein.

The processing system described above may utilize executable software routines to initiate process recipes or sequences. The software routines, when executed, may be used to precisely control the activation of the electronic control valves 132 for the execution of process sequences according to the present invention. Alternatively, the software routines may be performed in hardware, as an application specific integrated circuit or other type of hardware implementation, or a combination of software and hardware.

The processing chamber 100 described above is available from Applied Materials, Inc. located in Santa Clara, Calif. A more detailed description of the processing chamber 100 may be found in commonly assigned U.S. patent application Ser. No. 10/016,300, entitled "Lid Assembly For A Processing System To Facilitate Sequential Deposition Techniques", filed on Dec. 12, 2001, which is incorporated herein by reference. The processing chamber 100 may be integrated into a processing platform, such as an Endura platform also available from Applied Materials, Inc.

The plasma generator 200 and processing chamber 100 may be used to conformally deposit any type of dielectric or conductive film on a substrate surface. Dielectric layers include, for example, silicon oxide films, silicon carbon films, and carbon doped silicon oxide films. Conductive layers may include, for example, refractory metal films and refractory metal nitride films, in which the refractory metal is titanium, tantalum, or tungsten. The conductive layers may also include ternary layers, such as titanium silicon nitride or tantalum silicon nitride films. To further describe embodiments of the present invention, a processing sequence for forming a tantalum nitride (TaN) film using a rapid cycle deposition process will be described below.

Figure 3:
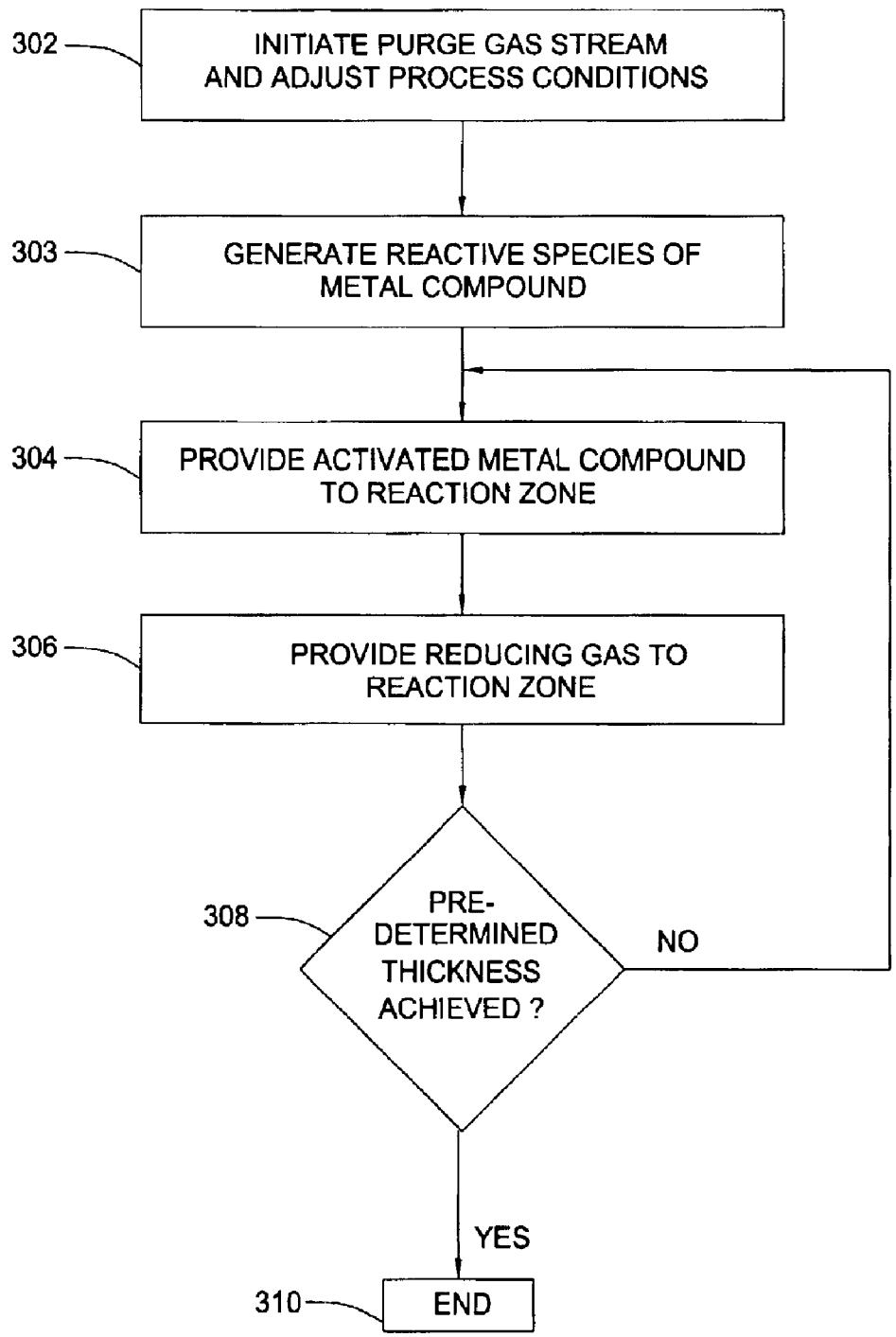
FIG. 3 illustrates a process flow sequence for cyclically depositing a tantalum nitride (TaN) film using according to embodiments of a processing system described herein.

FIG. 3 illustrates one process flow sequence 300 for depositing tantalum nitride (TaN) according to embodiments of the processing system described herein. The TaN barrier layer may be formed by alternately introducing one or more tantalum-containing compounds, such as $Ta(NMe_2)_5$ (PDMAT) for example, and one or more nitrogen-containing compounds, such as ammonia for example, to the substrate surface. However, any tantalum-containing compound may be used, such as $Ta(NEt_2)_5$ (PDEAT), $Ta(NMeEt)_5$ (PEMAT), $(Net_2)_3TaN\text{-}Bu$ (TBTDET), $(Net_2Me)_3TaN\text{-}Bu$ (TBTMET), $(NMe_2)_3TaN\text{-}Bu$ (TBTDMT), tantalum chloride ($TaCl_5$), tantalum bromide ($TaBr_5$), tantalum iodide ($TaI_5$), tantalum hydrides $(Cp)_2TaH_3$, $(CpMe)_2TaH_3$, and combinations thereof. Likewise, any nitrogen-containing compound may be used, such as hydrazine ($N_2H_4$), monomethyl hydrazine ($CH_3N_2H_3$), dimethyl hydrazine ($C_2H_6N_2H_2$), t-butyl hydrazine ($C_4H_9N_2H_3$), phenyl hydrazine ($C_6H_5N_2H_3$), 2,2'-azoisobutane (($CH_3)_6C_2N_2$), ethylazide ($C_2H_5N_3$), among others.

To initiate the cyclical deposition of the TaN layer, a carrier/purge gas such as argon is introduced into the processing chamber 100 to stabilize the pressure and temperature therein, as shown in step 302. Preferably, the chamber temperature is stabilized to between about 200° C. and about 300° C., and the pressure is stabilized to between about 1 Torr and about 5 Torr. The purge gas, such as helium (He), argon (Ar), nitrogen ($N_2$) and hydrogen ($H_2$), or combinations thereof, is then allowed to flow continuously during the deposition process such that only the purge gas flows between pulses of each compound. Typically, the purge gas continuously flows between about 100 sccm and about 1,000 sccm, such as between about 100 sccm and about 400 sccm, through each valve 132. Alternatively, once the pressure and temperature have been stabilized, the purge gas may be shut off and pulsed between pulses of compounds to assist the removal of the compounds from the chamber.

In step 303, at least a portion of the tantalum-containing source gas, PDMAT, is ignited into a plasma to form a volume of activated or excited species within the plasma generator 200. The PDMAT is activated using an RF power between about 200 Watts and about 1,500 Watts at a pressure at least slightly greater than the pressure within the process chamber. The plasma generator 200 remains in an "on" mode, and maintains the gas therein in the plasma state over repeated cycles.

In step 304, a fraction of the activated PDMAT is then pulsed to the reaction zone 159 at a rate between about 100 sccm and about 500 sccm, with a pulse time of about 0.3 seconds or less. Each fraction of PDMAT is less than the volume of activated PDMAT contained within the plasma generator 200, but is sufficient in volume to create at least a continuous monolayer on the substrate in the process chamber. As a result, activated PDMAT is readily available without a separate ignition step to either initiate or sustain the plasma within the generator 200. By eliminating the extra ignition step, product throughput and product repeatability is substantially increased.

In step 306, a pulse of ammonia is provided to the reaction zone 159 at a rate between about 200 sccm and about 600 sccm, with a pulse time of about 0.6 seconds or less. In one aspect, at least a portion of the ammonia is also activated using a separate, but similar, activated species generator 200 to create a volume of excited species. In this aspect, the ammonia is activated using an RF power between about 200 Watts and about 1,500 Watts at a pressure at least slightly greater than the pressure within the process chamber.

Steps 304 and 306 are then repeated until a desired thickness of the TaN film is formed on the substrate surface, as shown in step 308. Thereafter, the process is stopped at step 310 when the desired thickness for the film is achieved.

Referring again to steps 304 and 306, a pause between pulses of PDMAT and ammonia is typically between about 1.0 second or less, preferably about 0.5 seconds or less, more preferably about 0.1 seconds or less. However, it may be desirable to operate without a pause between PDMAT and ammonia such that at least a portion of a pulse of PDMAT and at least a portion of a pulse of ammonia at least partially over-lap within the processing chamber 100. In other words, at least a portion of a pulse of PDMAT may still be in the reaction zone 159 when at least a portion of a pulse of ammonia enters, allowing the reactive compounds to co-react much like in a CVD technique. Reducing time between pulses at least provides higher throughput.

Furthermore, the time interval for each pulse of PDMAT and ammonia is variable and depends on the volume capacity of the process chamber as well as the vacuum system coupled thereto. In general, the process conditions are advantageously selected so that each pulse provides a sufficient amount of compound so that at least a monolayer of the activated compound is conformally adsorbed on the substrate surface. Thereafter, excess compounds remaining in the chamber may be removed by the purge gas stream in combination with the vacuum system.

In the illustrated embodiment described above, the metal-containing compound and the nitrogen-containing compound were both ignited into a plasma of excited species. It should be understood that either the metal-containing compound or the nitrogen-containing compound or both could be ignited into a plasma to form a conformal, thin layer having desired physical and electrical properties. As is known in the art, plasma excited species are highly reactive at lower temperatures which increases product throughput, reduces cost of ownership and operation, and minimizes damage to the workpiece.

While the foregoing is directed to embodiments of the present invention, other and further embodiments of the invention may be devised without departing from the basic scope thereof, and the scope thereof is determined by the claims that follow.

What is claimed is:

1. A method for delivering activated species for a cyclical deposition process, comprising:

delivering into a plasma generator, a gas to be activated;

activating the gas to create a volume of reactive species;

delivering a fraction of the reactive species into a processing region to react with a substrate therein; and maintaining at least a portion of the activated gas remaining in the plasma generator in an activated state after delivering the fraction of reactive species into the process region.

2. The method of claim 1, wherein the fraction of reactive species delivered to the processing region is less than the volume of the reactive species within the plasma generator.

3. The method of claim 1, wherein the fraction of reactive species delivered to the processing region represents less than about 20 percent of the volume of the reactive species within the plasma generator.

4. The method of claim 1, wherein the fraction of reactive species delivered to the processing region represents less than about 10 percent of the volume of the reactive species within the plasma generator.

5. The method of claim 1, wherein the fraction of reactive species delivered to the processing region represents between about 0.01 percent and about 10 percent of the volume of the reactive species within the plasma generator.

6. The method of claim 1, wherein the gas comprises one or more precursors, reductants, catalysts, or combinations thereof.

7. The method of claim 1, wherein the gas comprises a metal-containing compound.

8. The method of claim 1, wherein the gas comprises a nitrogen-containing compound.

9. The method of claim 1, wherein activating at least a portion of the gas to create a volume of reactive species comprises at least partially dissociating the gas.

10. The method of claim 1, wherein the plasma generator comprises a high density plasma (HDP) generator, a microwave generator, radio-frequency (RF) generator, an inductive-coupled plasma (ICP) generator, a capacitively coupled generator, or combinations thereof.

11. The method of claim 1, wherein delivering a fraction of the reactive species comprises pulsing a portion of the volume of reactive species into the processing region.

12. A method for depositing films on a substrate surface, comprising:

delivering a gas to be activated into a plasma generator;

activating the gas to create a volume of one or more reactive species; and sequentially pulsing a fraction of the one or more reactive species and a second reactive compound into a processing region to deposit a film on the substrate surface while maintaining at least a portion of the activated gas remaining in the plasma generator in an activated state.

13. The method of claim 12, further comprising delivering the second reactive compound into a plasma generator to create a volume of one or more second reactive species.

14. The method of claim 12, further comprising sequentially pulsing a third reactive compound to the processing region.

15. The method of claim 14, further comprising delivering the third reactive compound into a plasma generator to create a volume of one or more third reactive species.

16. A method for depositing films on a substrate surface, comprising:

delivering a first gas to be activated into a first plasma generator;

activating at least a portion of the first gas to create a volume of one or more first reactive species;

providing a second gas to be activated into a second plasma generator;

activating at least a portion of the second gas to create a volume of one or more second reactive species; and sequentially pulsing a fraction of the one or more first reactive species and a fraction of the one or more second reactive species to a processing region to deposit a film on the substrate surface, while maintaining at least a portion of the at least one of said first and second gases in an activated state between pulses.

17. A method for depositing a film on a substrate surface comprising:

delivering first and second gases to first and second plasma generators;

activating at least a portion of the first and second gases in the plasma generators to create first and second volumes of reactive species;

positioning a substrate in a processing region; and alternately pulsing into the processing region a purge gas, a fraction of the volume of the first reactive species, a purge gas, and a fraction of the volume of the second reactive species in a repetitive sequence until a film of the desired thickness is deposited on the substrate surface, while maintaining at least a portion of the at least one of said first and second gases in an activated state between pulses.

* * * * *

UNITED STATES PATENT AND TRADEMARK OFFICE
CERTIFICATE OF CORRECTION

PATENT NO.        : 6,905,737 B2                                          Page 1 of 1
APPLICATION NO. : 10/269335
DATED             : June 14, 2005
INVENTOR(S)       : Donald J. Verplancken and Ashok K. Sinha It is certified that error appears in the above-identified patent and that said Letters Patent is hereby corrected as shown below:

In the Specification

Column 2, Line 58: Change "1200" to --200--

Column 7, Line 29: Change "(TaI$_5$)" to --(Ta1$_5$)--

Signed and Sealed this

Second Day of January, 2007

JON W. DUDAS
*Director of the United States Patent and Trademark Office*